United States Patent
Chinn et al.

(10) Patent No.: US 6,312,616 B1
(45) Date of Patent: Nov. 6, 2001

(54) PLASMA ETCHING OF POLYSILICON USING FLUORINATED GAS MIXTURES

(75) Inventors: Jeffrey Chinn, Foster City; Taeho Shin, San Jose; Nam-Hun Kim, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/206,201

(22) Filed: Dec. 3, 1998

(51) Int. Cl.$^7$ ................................................. H01L 21/461
(52) U.S. Cl. ............................... 216/68; 216/79; 438/719; 438/738
(58) Field of Search ....................... 216/2, 41, 67, 216/68, 72, 80; 438/719, 738

(56) References Cited

U.S. PATENT DOCUMENTS

| | | | |
|---|---|---|---|
| 4,666,555 | 5/1987 | Tsang | 156/643 |
| 4,726,879 | 2/1988 | Bondur et al. | 156/643 |
| 4,741,799 | 5/1988 | Chen et al. | 156/643 |
| 5,242,538 * | 9/1993 | Hamrah et al. | 156/643 |
| 5,358,601 | 10/1994 | Cathey | 156/656 |
| 5,429,070 | 7/1995 | Campbell et al. | 118/723 R |
| 5,433,823 | 7/1995 | Cain | 156/662.1 |
| 5,458,734 | 10/1995 | Tsukamoto | 156/643.1 |
| 5,498,312 | 3/1996 | Laermer et al. | 156/643.1 |
| 5,643,473 | 7/1997 | Tachi et al. | 216/67 |
| 5,658,472 | 8/1997 | Bartha et al. | 216/2 |
| 5,705,025 | 1/1998 | Dietrich et al. | 156/643.1 |
| 5,759,921 | 6/1998 | Rostoker | 438/711 |
| 5,767,021 | 6/1998 | Imai et al. | 438/719 |
| 5,843,847 * | 12/1998 | Pu et al. | 438/723 |
| 5,854,136 | 12/1998 | Huang et al. | 438/714 |
| 5,880,033 | 3/1999 | Tsai | 438/710 |
| 5,900,163 * | 5/1999 | Yi et al. | 216/79 |
| 5,994,160 | 11/1999 | Niedermann et al. | 438/53 |

FOREIGN PATENT DOCUMENTS

| | | | | |
|---|---|---|---|---|
| 0 497 023 A1 | 8/1992 | (EP) | | H01L/21/306 |
| 0 843 340 A2 | 5/1998 | (EP) | | H01L/21/00 |
| 2 313 230 A | 11/1997 | (GB) | | H01L/21/306 |
| 06188224 | 7/1994 | (JP) | | H01L/21/302 |

OTHER PUBLICATIONS

Ramaswami et al. "Polysilicon Planarization Using Spin–On Glass" *Journal of the Electrochemical Society*, vol. 139, No. 2, pp. 591–599, Feb. 1992.

* cited by examiner

Primary Examiner—Randy Gulakowski
Assistant Examiner—Allan Olsen
(74) Attorney, Agent, or Firm—Moser, Patterson & Sheridan; Joseph Bach

(57) ABSTRACT

A method of etching polysilicon using a fluorinated gas chemistry to provide an etch rate in excess of 10,000 Å/min and a photoresist selectivity of better than 3:1. The method is accomplished using a combination of a fluorinated gas and a fluorocarbon gas, e.g., 50–60 sccm of $SF_6$, 1–40 sccm of $CHF_3$, and 40–50 sccm of $O_2$ with a total chamber pressure of 4–60 mTorr. The power applied to the etch chemistry to produce an etching plasma is 400–1500 watts of inductive source power (at 13.56 MHz) via an inductively coupled antenna and 200–1500 watts (at 12.56 MHz) of cathode bias power applied via a cathode electrode within a wafer support pedestal. The pedestal supporting the wafer was maintained at 0–50 degrees C.

11 Claims, 2 Drawing Sheets

PLASMA ETCHING OF POLYSILICON USING FLUORINATED GAS MIXTURES

BACKGROUND OF THE DISCLOSURE

1. Field of the Invention

The invention relates to processes for etching silicon and, more particularly, the invention relates to a method of etching polysilicon to form a storage node for an integrated circuit memory device.

2. Description of the Background Art

Trenches formed in semiconductor substrates have many uses in producing integrated circuits including isolation, capacitor formation, transistor formation, and the like. One important use of trenches is in the formation of a trench capacitor as a storage node for a dynamic random access memory (DRAM) device. Trench capacitors are desirable because they occupy a relatively small area, while having large electrode surface area due to the depth of the trench used to form the capacitor. In a conventional trench capacitor, the trench walls form one electrode of the capacitor, the walls are coated with a thin dielectric material and then the remaining trench is filled with polysilicon such that the polysilicon forms the second electrode of the capacitor. As such, trench-based DRAM devices utilize less area than other forms of memory devices that use planar or stacked capacitors. To maximize the capacitance of the trench capacitor, the surface area of the trench walls is maximized, i.e., the trench is deep and the walls are substantially vertical.

Another form of storage node is created by masking and etching a layer of polysilicon to create protrusions of polysilicon that rise from an oxide layer. The protrusions are isolated from one another by the supporting oxide layer. The polysilicon is then coated with a thin dielectric layer and an outer coating of polysilicon is applied to the dielectric layer such that the inner polysilicon protrusion and the outer polysilicon layer form the electrodes of the capacitor. This form of storage enables the surface of the inner polysilicon to be tailored to achieve a large surface area.

Traditionally, storage nodes are formed using an anisotropic chemical or reactive ion etching of a masked polysilicon substrate. Etching chemistries utilize combinations of such chemicals as HBr, $Cl_2$, $O_2$, $SF_6$, and $N_2$. The etch rate of polysilicon when exposed to combinations of such chemicals is approximately 4000 Å/min with a photoresist selectivity of less than 2:1, typically 1.8:1 is readily achievable. The maximum etch rate is directly proportional to the maximum achievable throughput for processing a wafer, i.e., the slower the etch rate, the less wafers are completely processed in a unit of time. As such, it is desirable to increase throughput of the process by increasing the etch rate. However, it is generally known that an increase in the etch rate decreases the etch selectivity. As such, for high etch rates a thick layer of photoresist (e.g., 8000 to 9000 Å) is necessary. Such a thick photoresist causes incorrect etching of the storage node side walls resulting in anomalous sidewall definition and improper storage node operation.

Therefore, a need exists in the art for a polysilicon etching method that increases the etch rate without impacting photoresist selectivity.

SUMMARY OF THE INVENTION

The disadvantages associated with the prior art are overcome by the present invention of a method of etching polysilicon that uses a fluorinated gas chemistry such as a sulfur hexafluoride/trifluoromethane/oxygen ($SF_6$/$CHF_3$/$O_2$) chemistry to provide an etch rate in excess of 10,000 Å/min and a photoresist selectivity of better than 3:1. The method is accomplished using, for example, a combination of 50–60 sccm of $SF_6$, 1–40 sccm of a fluorocarbon such as $CHF_3$, and 40–50 sccm of $O_2$ with a total chamber pressure of 4–60 mTorr. The power applied to the etch chemistry to produce an etching plasma is 400–1500 watts of inductive source power (at 12.56 MHz) via an inductively coupled antenna and 200–1500 watts (at 13.56 MHz) of cathode bias power applied via a cathode electrode within a wafer support pedestal. The temperature of the dome supporting the antenna was 80 degrees C., the walls of the chamber were at 65 degrees C. and the pedestal supporting the wafer was maintained at 0–50 degrees C.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The etch process of the present invention is accomplished in a Silicon Etch DPS (Decoupled Plasma Source) Centura® etch system available from Applied Materials, Inc. of Santa Clara, Calif. A detailed description of the DPS system was described by Yan Ye et al. at the Proceedings of the Eleventh Symposium of Plasma Processing, May 7, 1996, and is published in the Electrochemical Society Proceedings, Volume 96–12, pp. 222–233 (1996).

Figure 1:
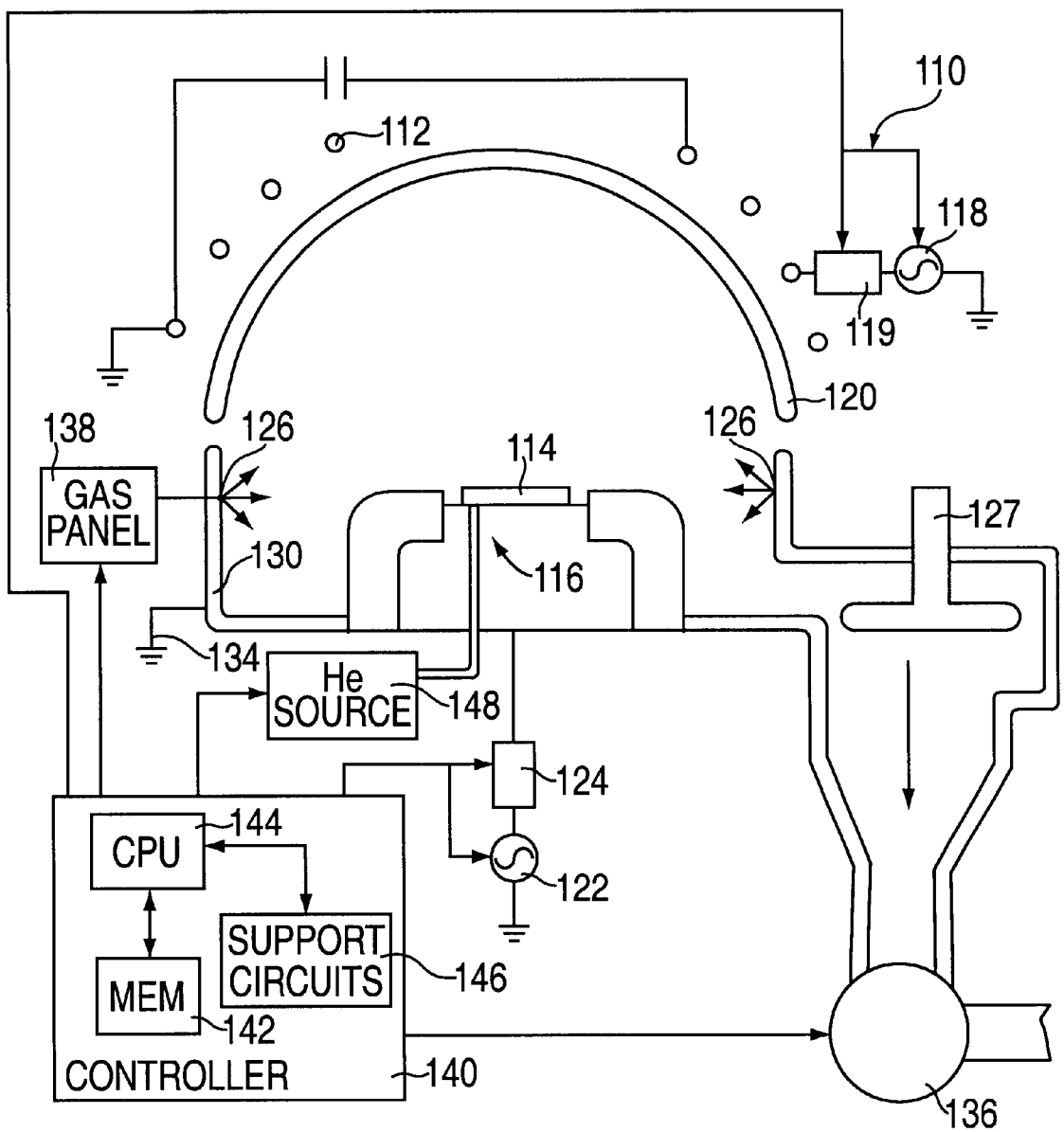
FIG. 1 depicts a schematic diagram of a plasma processing apparatus of the kind used in performing the etching processes of the present invention.

FIG. 1 depicts a schematic diagram of the DPS etch processing chamber 110, which is constructed to include at least one inductive coil antenna segment 112, positioned exterior to a dielectric, dome-shaped ceiling 120 (referred to herein as the dome 120), and connected to a radio-frequency (RF) source 118 (which is generally capable of producing an RF signal having a tunable frequency of about 12.56 MHz). The RF source 118 is coupled to the antenna 112 through a matching network 119. Process chamber 110 also includes a substrate support pedestal (cathode) 116 which is connected to a second RF source 122 which is generally capable of producing an RF signal having a frequency of approximately 13.56 MHz. The source 122 is coupled to the cathode 116 through a matching network 124. The chamber 110 also contains a conductive chamber wall 130 that is connected to an electrical ground 134. A controller 140 comprising a central processing unit (CPU) 144, a memory 142, and support circuits 146 for the CPU is coupled to the various components of the DPS etch processing chamber 110 to facilitate control of the etch process.

In operation, the semiconductor substrate 114 is placed on the substrate support pedestal 116 and gaseous components are supplied from a gas panel 138 to the process chamber 110 through entry ports 126. A plasma is ignited in the process chamber 110 by applying RF power from the RF sources 118 and 122 respectively to the antenna 112 and the cathode 116. The pressure within the interior of the etch chamber 110 is controlled using a vacuum pump 136 and a throttle valve 127 situated between the chamber 110 and the vacuum pump 136. The temperature at the surface of the chamber walls 130 is controlled using liquid-containing conduits (not shown) which are located in the walls 130 of the chamber 110.

The temperature of the substrate 114 is controlled by stabilizing the temperature of the support pedestal 116 and flowing helium gas from source 148 to the channels formed by the back of the substrate 114 and grooves (not shown) on the pedestal surface. The helium gas is used to facilitate heat transfer between the substrate 114 and the pedestal 116. During the etch process, the substrate 114 is gradually heated by the plasma to a steady state temperature of approximately 30–130 degrees C. Using thermal control of both the dome 120 and the pedestal 116, the substrate 114 is maintained at a temperature of 0 to 50 degrees C. To achieve this substrate temperature, the dome 120 is maintained at approximately 80 degrees C. and the chamber walls are maintained at approximately 65 degrees C.

The RF power applied to the inductive coil antenna 112 has a frequency between 50 kHz and 13.56 MHz and may vary in power from a few hundred watts to several thousand watts. The power applied to the pedestal may be DC or RF. In the preferred embodiment of the invention, the antenna power has a frequency of 12.56 MHz and a power of between 400 and 1500 watts, while the bias power has a frequency of 13.56 MHz with a power of between 200 and 450 watts.

To facilitate control of the chamber as described above, the CPU 144 may be one of any form of general purpose computer processor that can be used in an industrial setting for controlling various chambers and subprocessors. The memory 142 is coupled to the CPU 144. The memory 142 may be one or more of readily available memory such as random access memory (RAM), read only memory (ROM), floppy disk, hard disk, or any other form of digital storage. The support circuits 146 are coupled to the CPU 144 for supporting the processor in a conventional manner. These circuits include cache, power supplies, clock circuits, input/output circuitry and subsystems, and the like. The control software that is used for implementing the etching process of the present invention is generally stored in memory 142 as a software routine. The software may also be stored and/or executed by a CPU that is remotely located from the hardware being controlled by the CPU.

When executed by the CPU 144, the software routine transforms the general purpose computer into a specific purpose computer (controller 140) that controls the chamber operation such that the etching process is performed. The specific process steps performed by the software routine are discussed in detail with respect to FIGS. 2A and 2B below.

Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Figure 2A:
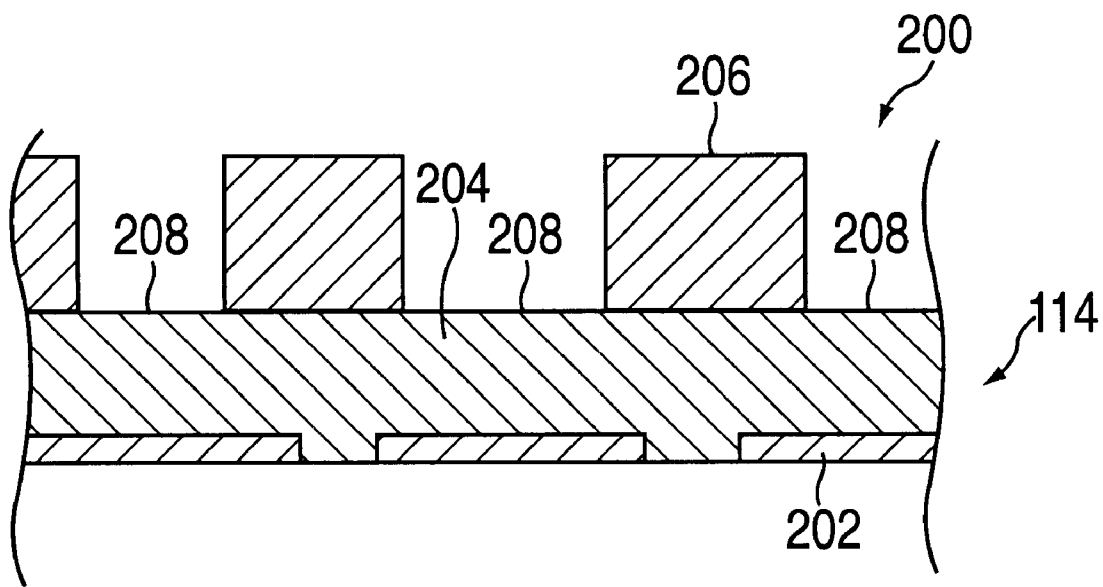
FIG. 2A depicts a cross-sectional illustration of a substrate prior to being etched by the method of the present invention.

FIG. 2A depicts a cross-sectional profile of a pre-etch film structure 200 containing a 1000 Å thick oxide layer 202 supporting an 8–10000 Å thick polysilicon layer 204 that is masked using a 7000 Å thick deep ultra-violet (DUV) photoresist layer 206. The DUV photoresist layer 206 is, for example, APEX E available from Shipley Corporation of Marlboro, Mass. To form an inner polysilicon electrode of storage node, the photoresist layer 206 is conventionally patterned to expose portions 208 of the polysilicon layer 204 to the reactive etch chemicals. The etch process of the present invention, as performed in the chamber 110 described above, removes material in the exposed portions 208 of the polysilicon layer 204 to leave protrusions of polysilicon that will form one electrode of a storage node. In essence, the protrusions are formed by etching a moat in the polysilicon around each desired protrusion location.

Figure 2B:
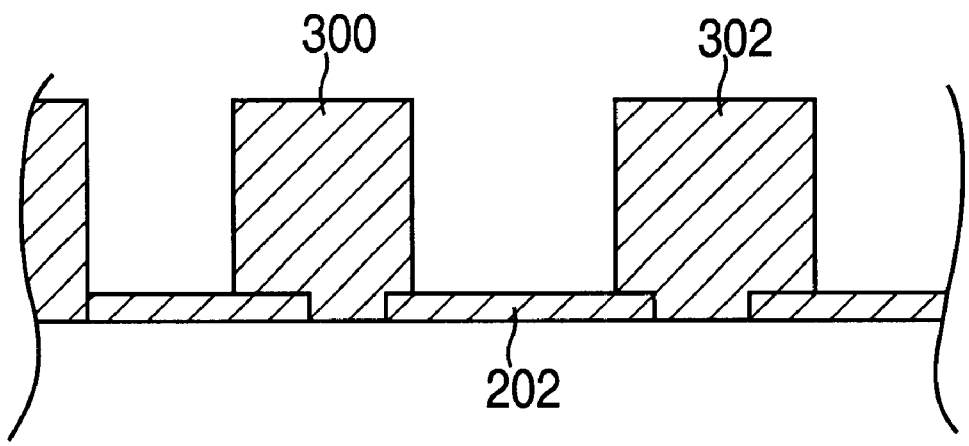
FIG. 2B depicts the cross sectional illustration of the substrate of FIG. 2A after being etched by the method of the present invention to form a pattern in a polysilicon layer.

FIG. 2B depicts a cross-sectional profile of a pair of polysilicon protrusions 300 and 302 that will be used to form inner polysilicon electrodes. Of course, for use in a DRAM device, the process creates as many as 256 million protrusions for use as storage nodes in a 256 Mbyte DRAM. To facilitate redundancy in a 256 Mbyte DRAM, the device may have as many as 512 million storage nodes. The protrusions 300 and 302 are separated by between 0.18 and 0.25 µm of the oxide layer, i.e., the protrusions are electrically isolated from one another. Each of the protrusions has an oval base with dimensions of 0.5 µm by 0.18 µm and has a vertical height of approximately 8000–10000 Å. The sides of each protrusion are substantially vertical having a typical angle is between 87 and 90 degrees relative to the horizontal surface of the oxide layer. However, the sides can be tapered or profiled in some manner to increase the surface area of the electrode.

To achieve this structure, the present invention uses a chemistry containing a mixture of fluorinated gases such as a mixture of $SF_6/CHF_3/O_2$. This chemistry provides an etch rate in excess of 10,000 Å/min and a photoresist selectivity of better than 3:1. The method is accomplished in the DPS Etch Chamber described above using a combination of 50–60 sccm of $SF_6$, 1–40 sccm of $CHF_3$, and 40–50 sccm of $O_2$ with a total chamber pressure of 4–60 mTorr. The gases are supplied from the gas panel 138 and the pressure is set by the vacuum pump 136 and the valve 127. Both the chamber pressure and the gas flow rates are controlled by controller 140.

Other fluoro-hydro-carbon gases can be substituted for $CHF_3$ including difluoromethane ($CH_2F_2$) and fluoromethane ($CH_3F$) and the like, i.e., any gas containing carbon, hydrogen and fluorine. The flow rate is reduced for fluorocarbon gases having a more polymerizing characteristic, i.e., the flow rate for $CH_3F$ is less than that for $CHF_3$. Also, other fluorine based gases can be substituted for $SF_6$ including nitrogen trifluoride ($NF_3$), tetrafluoromethane ($CF_4$) and the like.

The power applied to the chemistry to produce an etching plasma is 400–1500 watts of inductive source power at 12.56 MHz and 200–1500 watts of cathode bias power at 13.56 MHz. Once the reactive gases are present in the chamber at sufficient pressure, the controller 140 activates the power sources 118 and 122 as well as controls the matching networks 119 and 124 to achieve an efficient coupling of the RF power to the chamber. Additionally, throughout the etch process, the controller 140 maintains a uniform wafer temperature by controlling the helium source 148 as well as the coolant flow through the chamber walls 130 and over the dome 120. As such, the temperature of the dome supporting the antenna was approximately 80 degrees C., the walls were at approximately 65 degrees C. and the pedestal was maintained at 0–50 degrees C.

Under the foregoing conditions, the present invention achieves an etch rate for the polysilicon of greater than 10,000 Å/min with a photoresist selectivity of greater than 3:1 and an oxide selectivity of greater than 10:1.

In one illustrative example that achieved this result using the DPS etch processing chamber, the following recipe was used in the DPS etch chamber described above:

| | |
|---|---|
| $SF_6$ | '055 sccm |
| $CHF_3$ | 5 sccm |
| $O_2$ | 14 sccm |
| Antenna Power | 1500 Watts |
| Cathode Power | 200 Watts |
| Pedestal Temperature | 10° C. |

Although various embodiments which incorporate the teachings of the present invention have been shown and described in detail herein, those skilled in the art can readily devise many other varied embodiments that still incorporate these teachings.

What is claimed is:

1. A method of plasma etching a layer of polysilicon within a chamber comprising the steps of:
   supplying a plasma source gas containing a fluorinated gas and a fluorohydrocarbon gas to the chamber;
   igniting a plasma within the chamber; and
   etching said polysilicon.

2. The method of claim 1 wherein said igniting step comprises the step of applying a bias power to a cathode electrode of 200 to 450 watts.

3. The method of claim 1 wherein said igniting step comprises the step of applying an inductive source power to an inductively coupled antenna of 400 to 1500 watts.

4. The method of claim 1 wherein the chamber pressure is between 4 to 60 mTorr.

5. The method of claim 1 wherein the etching step further comprises the steps of:
   etching said polysilicon at a rate exceeding 5000 Å/min; and
   etching a photoresist layer at a rate less than half the etch rate of the polysilicon.

6. The method of claim 1 wherein, during the etching step, a pedestal that supports the layer of polysilicon within the chamber is maintained at a temperature between 0 and 50 degrees Celsius.

7. A method of plasma etching a layer of polysilicon comprising the steps of:
   supplying a plasma source gas containing $SF_6$, $CHF_3$ and oxygen to a chamber, with the $SF_6$, $CHF_3$, and oxygen gases supplied at flow rates between about 50–60 sccm, about 1–40 sccm, and about 40–50 sccm, respectively;
   igniting a plasma within the chamber by applying a bias power to a cathode electrode of 200 to 450 watts and by applying an inductive source power to an inductively coupled antenna of 400 to 1500 watts; and
   etching said polysilicon.

8. The method of claim 7 wherein a gas pressure within the chamber is between 4 to 60 mTorr.

9. The method of claim 7 wherein the etching step further comprises the steps of:
   etching said polysilicon at a rate exceeding 5000 Å/min; and
   etching a photoresist layer at a rate less than half the etch rate of the polysilicon.

10. The method of claim 7 wherein, during the etching step, a pedestal that supports the layer of polysilicon within the chamber is maintained at a temperature between 0 and 50 degrees Celsius.

11. A method of plasma etching a layer of polysilicon within a chamber comprising the steps of:
   supplying a plasma source gas containing $SF_6$, a fluorohydrocarbon gas selected from the group consisting of $CHF_3$, $CH_2F_2$ and $CH_3F$, and oxygen to the chamber, with $SF_6$, the fluorohydrocarbon gas, and the oxygen supplied at flow rates between about 50–60 sccm, about 1–40 sccm, and about 40–50 sccm, respectively;
   igniting a plasma within the chamber by applying a source power to an inductively coupled antenna; and
   etching said polysilicon.

* * * * *

UNITED STATES PATENT AND TRADEMARK OFFICE
CERTIFICATE OF CORRECTION

PATENT NO.   : 6,312,616 B1                                              Page 1 of 1
DATED        : November 6, 2001
INVENTOR(S)  : Chinn et al.

It is certified that error appears in the above-identified patent and that said Letters Patent is hereby corrected as shown below:

<u>Column 2,</u>
Line 1, please replace "($SF_6$/$CHF_3$/)$O_2$)" with -- ($SF_6$/$CHF_3$/$O_2$) --.

<u>Column 5,</u>
Line 23, please replace claim 1 with the following:
  -- 1. A method of plasma etching a layer of polysilicon within a chamber comprising the steps of:
    supplying a plasma source gas containing a fluorinated gas selected from the group consisting of $SF_6$, $NF_3$ and $CF_4$, a fluorohydrocarbon gas selected from the group consisting of $CHF_3$, $CH_2F_2$, and $CH_3F$, and oxygen to the chamber, with the fluorinated gas, the fluorohydrocarbon gas, and the oxygen supplied at flow rates between about 50-60 sccm, about 1-40 sccm, and about 40-50 sccm, respectively;
    igniting a plasma within the chamber by applying a source power to an inductively coupled antenna; and
    etching said polysilicon. --

Signed and Sealed this

Twenty-third Day of July, 2002

Attest:

Attesting Officer

JAMES E. ROGAN
*Director of the United States Patent and Trademark Office*